(12) United States Patent
Egami et al.

(10) Patent No.: US 11,312,634 B2
(45) Date of Patent: Apr. 26, 2022

(54) PRODUCTION METHOD FOR DISPERSION LIQUID OF SILICA PARTICLE

(71) Applicant: JGC CATALYSTS AND CHEMICALS LTD., Kanagawa (JP)

(72) Inventors: Miki Egami, Fukuoka (JP); Mitsuaki Kumazawa, Fukuoka (JP); Hirotada Arakane, Fukuoka (JP); Ryo Muraguchi, Fukuoka (JP); Toshiharu Hirai, Kanagawa (JP)

(73) Assignee: JGC CATALYSTS AND CHEMICALS LTD., Kanagawa (JP)

(*) Notice: Subject to any disclaimer, the term of this patent is extended or adjusted under 35 U.S.C. 154(b) by 347 days.

(21) Appl. No.: 16/498,433

(22) PCT Filed: Mar. 29, 2018

(86) PCT No.: PCT/JP2018/013240
§ 371 (c)(1),
(2) Date: Sep. 27, 2019

(87) PCT Pub. No.: WO2018/181713
PCT Pub. Date: Oct. 4, 2018

(65) Prior Publication Data
US 2020/0231451 A1    Jul. 23, 2020

(30) Foreign Application Priority Data
Mar. 31, 2017 (JP) .............................. JP2017-071502

(51) Int. Cl.
*C01B 33/141* (2006.01)
*C09G 1/02* (2006.01)
*C09K 3/14* (2006.01)

(52) U.S. Cl.
CPC .............. *C01B 33/141* (2013.01); *C09G 1/02* (2013.01); *C09K 3/1409* (2013.01); *C01P 2004/32* (2013.01)

(58) Field of Classification Search
CPC ...... C01B 33/141; C09G 1/02; C09K 3/1409; C01P 2004/32
See application file for complete search history.

(56) References Cited

U.S. PATENT DOCUMENTS

2006/0150860 A1    7/2006 Nozaki

FOREIGN PATENT DOCUMENTS

| JP | 6-056418 | 3/1984 |
| JP | 62-052119 | 3/1987 |

(Continued)

OTHER PUBLICATIONS

International Search Report issued in International Patent Application No. PCT/JP2018/013240, dated Jun. 19, 2018.

(Continued)

*Primary Examiner* — Pegah Parvini
*Assistant Examiner* — Ross J Christie
(74) *Attorney, Agent, or Firm* — Greenblum & Bernstein, P.L.C.

(57) ABSTRACT

A method for producing a dispersion liquid of silica particles, by simultaneously adding a liquid A containing silane alkoxide and a liquid B containing an alkali catalyst and water to a liquid I containing silica seed particles to cause the particles to grow, so as to produce silica particles; wherein the variation rate of the mole ratio of the alkali catalyst to silica components in the reaction system during a period from the start to the end of the addition relative to the initial mole ratio is 0.90 to 1.10; and the variation rate of the mole ratio of water to the silica components in the (Continued)

reaction system during a period from the start to the end of the addition relative to the initial mole ratio is 0.90 to 1.10.

16 Claims, 3 Drawing Sheets

(56) References Cited

FOREIGN PATENT DOCUMENTS

| | | |
|---|---|---|
| JP | 4-240112 | 8/1992 |
| JP | 11-060232 | 3/1999 |
| JP | 2004-203638 | 10/2004 |
| JP | 2005-060217 | 3/2005 |
| JP | 2010-182811 | 8/2010 |
| JP | 2012-156393 | 8/2012 |
| JP | 2014-154707 | 8/2014 |
| JP | 2015-124231 | 7/2015 |
| WO | 2004/074180 | 9/2004 |

OTHER PUBLICATIONS

International Preliminary Report on Patentability in International Patent Application No. PCT/JP2018/013240, dated Oct. 1, 2019 with English translation.

[FIG. 1]
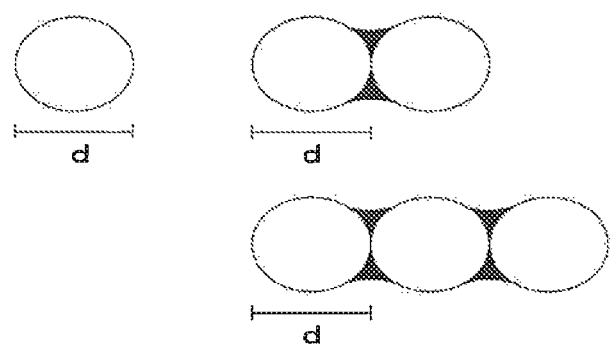
[FIG. 2]
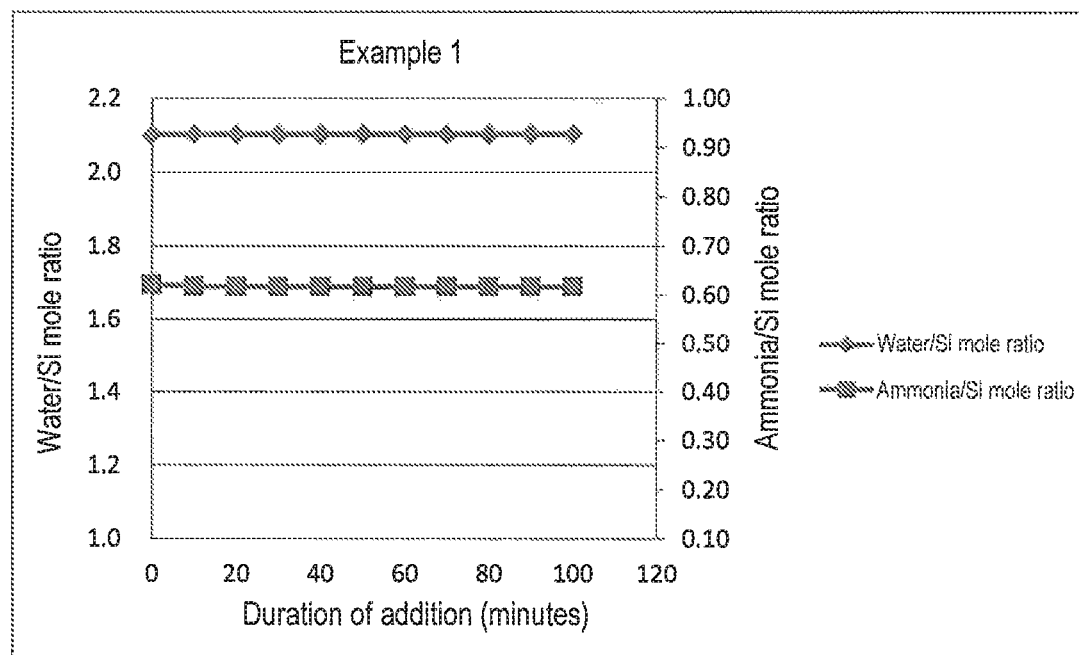

[FIG. 3]
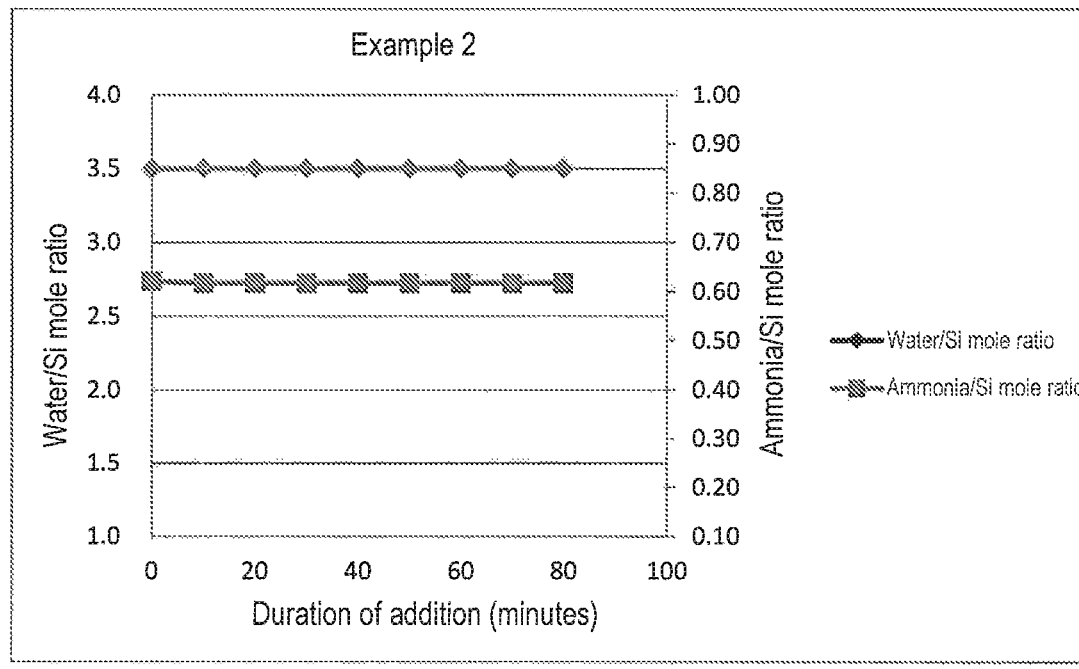
[FIG. 4]
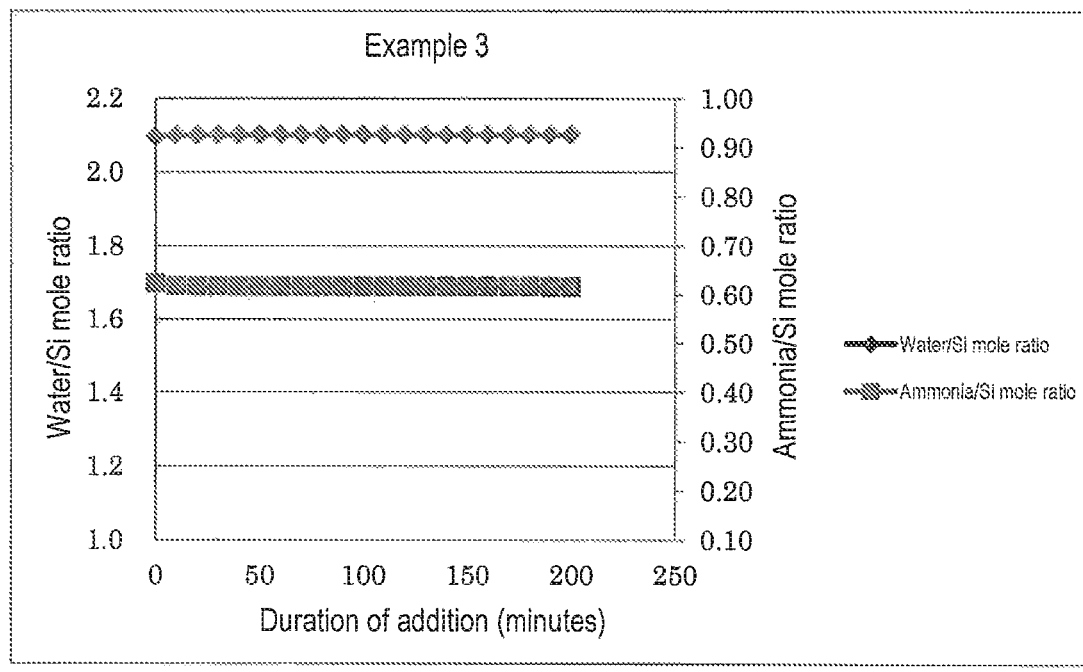

[FIG. 5]
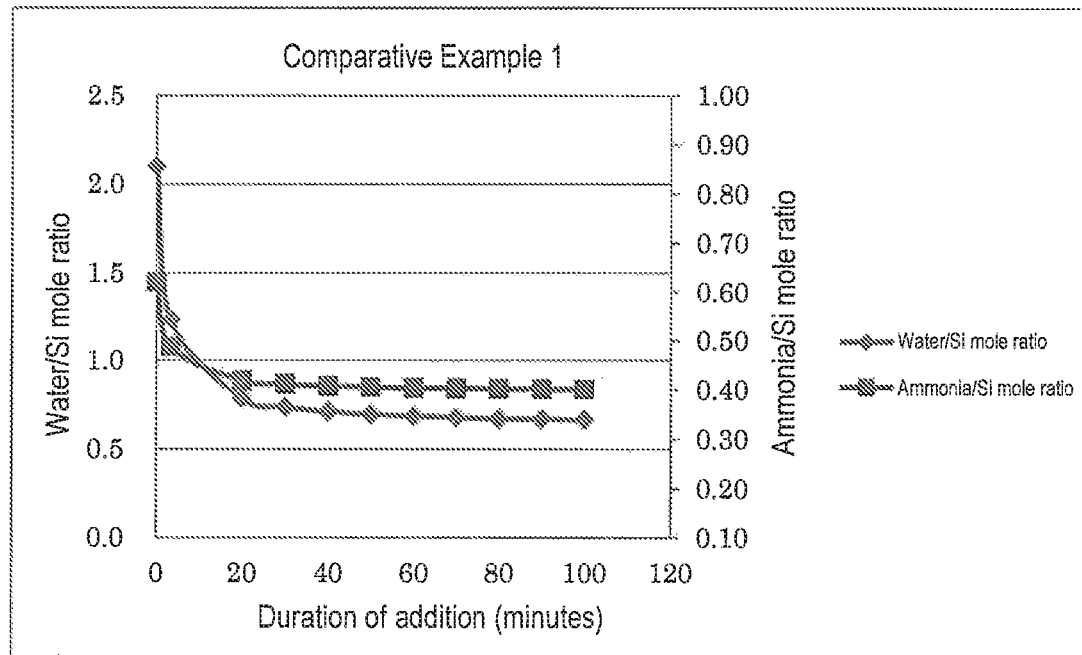
[FIG. 6]
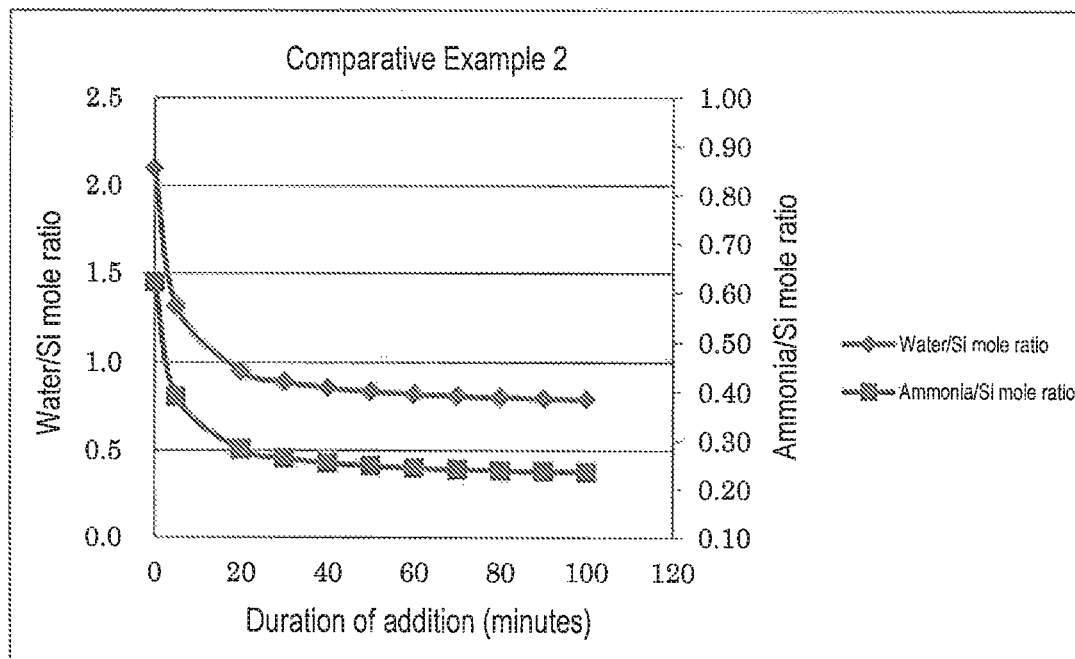

PRODUCTION METHOD FOR DISPERSION LIQUID OF SILICA PARTICLE

TECHNICAL FIELD

The present invention relates to a method for producing a dispersion liquid of silica particles and particularly to a method for producing a dispersion liquid comprising silica particles useful for an abrasive used in polishing during formation of a metal wiring layer on a semiconductor integrated circuit, etc.

BACKGROUND ART

Various integrated circuits are used for computers and various electronic devices. As they are downsized and become sophisticated, higher density and higher performance have been required for circuits.

To produce a semiconductor integrated circuit, for example, an interlayer film (insulating film) is formed on a substrate such as a silicon wafer, a groove pattern for a metal wiring is formed on the interlayer film (insulating film), a barrier metal layer of tantalum nitride (TaN) or the like is formed by a sputtering method or the like, as necessary, and then a copper film for a metal wiring is formed by a chemical vapor deposition (CVD) method or the like. Here, when a barrier metal layer of TaN or the like is provided, the barrier metal layer can prevent, for example, lowering of the insulation properties of the interlayer insulating film in association with the diffusion of copper or an impurity or the like to the interlayer insulating film or erosion of the interlayer insulating film, and can enhance the adhesion between the interlayer insulating film and copper.

Subsequently, a film of unnecessary copper and barrier metal (occasionally referred to as "sacrifice layer") formed on a portion out of the groove is removed by polishing with a chemical-mechanical polishing (CMP) method and the upper surface is flattened to the maximum extent possible, and thus a wiring/circuit pattern of copper is formed by leaving a metal film only in the groove.

The abrasive used in the CMP method is typically produced by adding an additive for increasing the polishing speed of a wiring/circuit metal such as an oxidant and an organic acid to a dispersion liquid comprising spherical polishing particles consisting of a metal oxide such as silica and having an average particle diameter of about 5 to 300 nm.

When incompletely reacted materials (by-products) such as oligomers of silane alkoxide are present in the dispersion liquid (silica sol) comprising the polishing particles, the silica sol has not had a sufficient stability, presumably due to the influence of the incompletely reacted materials such as highly reactive oligomers. Further, thickening, aggregation, white turbidity, generation of a sedimentary gel, etc., sometimes have occurred due to the influence of additives mixed to the dispersion liquid when used as an abrasive. Use of such an abrasive sometimes has resulted in appearance of scratches due to aggregates and has caused a problem by silica components remaining on a substrate after polishing (e.g., see Patent Literatures 1, 2, and 3). Furthermore, in some cases, the silica sol has adsorbed an additive for enhancing the abrasive property, resulting in reduction in the effect of the additive.

As a method for producing a silica sol in which the generation of such incompletely reacted materials such as oligomers is suppressed, for example, proposed is a method which comprises (a) a step of adding an organic solvent containing tetramethoxysilane and a solvent containing an alkali catalyst and water to an organic solvent containing an alkali catalyst and water to cause hydrolysis and polycondensation of tetramethoxysilane, so as to produce a silica sol; and (b) a step of heating a dispersion medium of the silica sol to a boiling point of water to substitute with water (see Patent Literature 4).

On the other hand, truly spherical and irregular-shaped silica particles are produced as a silica particle used as an abrasive. The irregular-shaped silica particles are suitably used for an abrasive emphasizing a polishing speed.

For example, the method described in Patent Literature 4 produces irregular-shaped silica particles in which the average particle diameter of a secondary particle is 1.5 to 3.0 times the average particle diameter of a primary particle diameter.

As another method for producing an irregular-shaped silica particle is also proposed a method in which methyl silicate or a mixture of methyl silicate and methanol is dropped under stirring for 10 to 40 minutes into a mixed solvent consisting of water, methanol and ammonia, or water, methanol, ammonia and an ammonium salt with the content of an ammonium ion in the solvent being 0.5 to 3% by weight based on the total weight of the solvent so that the reaction is performed at a temperature of 10 to 30° C., to cause methyl silicate to react with water (see Patent Literature 5). This method can produce a colloidal silica having a short diameter of 10 to 200 nm and a "long diameter/short diameter ratio" of 1.4 to 2.2.

A method for producing a peanut-like twin colloidal silica particle is also proposed in which a tetraalkoxysilane or a mixture of a tetraalkoxysilane and a water-miscible organic solvent as a raw material is continuously added into an aqueous solvent containing an ammonium ion to cause hydrolysis and condensation of the tetraalkoxysilane, while controlling the total addition amount of the raw materials in the range of 2.0 to 6.0 times the addition amount of the raw materials required for coalescence of two single silica particles in the initial stage of the reaction (see Patent Literature 6).

A method for producing a cocoon-type colloidal silica is further proposed in which a condensate of an alkoxysilane or a solution thereof in an aqueous solvent is dropped into an aqueous solution of ammonia or an ammonium salt, or an aqueous solution containing ammonia or an ammonium salt and an aqueous solvent while causing hydrolysis of the alkoxysilane (see Patent Literature 7).

CITATION LIST

Patent Literature

Patent Literature 1: Japanese Patent Laid-Open No. 2015-124231, paragraphs [0002] and [0006]
Patent Literature 2: Japanese Patent Laid-Open No. 2012-156393, paragraph [0006]
Patent Literature 3: Japanese Patent Laid-Open No. 2014-154707, paragraph [0007]
Patent Literature 4: Japanese Patent Laid-Open No. 2005-060217
Patent Literature 5: Japanese Patent Laid-Open No. 11-060232
Patent Literature 6: Japanese Patent Laid-Open No. 2004-203638

Patent Literature 7: International Publication No. WO 2004/074180

SUMMARY OF INVENTION

Technical Problem

The method described in Patent Literature 4 produces a highly-pure silica particle in a good productivity. However, in step (a), it does not grow up to silica particles which are intended to be produced, and incompletely reacted materials such as oligomers of silane alkoxide are produced. So, step (b) to remove these becomes required. Therefore, this method has a problem from the standpoint of production efficiency, cost, etc.

The method described in Patent Literature 5 also has a problem in that it generates incompletely reacted materials. The concentration of silica particles in a dispersion liquid of silica particles produced is also very low. In addition, a particle in which five or more primary particles are linked to each other is spherical and is not chain-shaped (paragraph [0011]).

The methods described in Patent Literatures 6 and 7 also have a problem in that it generates incompletely reacted materials. In addition, the method described in Patent Literature 7 is a special method using a condensate of silane alkoxide as a raw material.

In view of the above circumstances, the present invention provides a method for producing a dispersion liquid of silica particles, comprising suppressing generation of incompletely reacted materials to efficiently produce silica particles.

Solution to Problem

By keeping the amounts of water and an alkali catalyst relative to silica components in the reaction system, which greatly affect the reaction (hydrolysis and polycondensation) involved in the formation of silica particles, to be constant during the reaction period, the reaction can always proceed under the same conditions during the reaction period. This suppresses generation of incompletely reacted materials.

In addition, by producing the desired seed particles once and allowing the reaction to proceed by using a liquid I containing the seed particles so as to satisfy the above conditions, the generation of incompletely reacted materials is further suppressed, and therefore, the particles that are controlled in shape to the intended shape can be produced in a shorter time. In particular, when producing irregular-shaped particles in which primary particles are linked to each other, a degree (number) of linking can be easily controlled.

That is, the present invention is a method for producing a dispersion liquid of silica particles, comprising: providing a liquid I containing silica seed particles having an average particle diameter of 3 to 100 nm in advance in a container; and simultaneously adding a liquid A containing silane alkoxide and a liquid B containing an alkali catalyst and water to the liquid I to cause hydrolysis and polycondensation of the silane alkoxide and thereby cause the silica seed particles to grow, so as to produce silica particles. The production method satisfies the following conditions (1) and (2):

(1) the variation rate of the mole ratio of the alkali catalyst to silica components in the reaction system during a period from the start of the addition (start of the reaction) to the end of the addition relative to the initial mole ratio of the alkali catalyst to the silica components is 0.90 to 1.10; and (2) the variation rate of the mole ratio of the water to the silica components in the reaction system during a period from the start of the addition (start of the reaction) to the end of the addition relative to the initial mole ratio of the water to the silica components is 0.90 to 1.10.

Hereinafter in the present specification, the expression "variation rate of the mole ratio of an alkali catalyst to silica components in the reaction system for a period from the start of the reaction (start of the addition) to the end of the addition relative to the initial mole ratio of the alkali catalyst to the silica components" is simply referred to as "variation rate of catalyst proportion". The expression "variation rate of the mole ratio of water to silica components in the reaction system for a period from the start of the reaction (start of the addition) to the end of the addition relative to the initial mole ratio of the water to the silica components" is simply referred to as "variation rate of water proportion".

The expression "silica components in the reaction system" used herein refers to silica seed particles and products produced by hydrolysis and polycondensation of the added silane alkoxide. The mass of the silica seed particles in the liquid I is calculated from the masses measured before and after drying 5 g of a sample collected at 1000° C. for 1 hour.

Each of the proportion of a catalyst to silica components (alkali catalyst/silica components) and the proportion of water to silica components (water/silica components) in the reaction system is calculated on the basis of the molar amount of silica components based on the mass of silica seed particles and the actual measured addition amount of silane alkoxide (in terms of Si). In this case, calculation is made, assuming that the hydrolysis and polycondensation reactions of silane alkoxide take place instantaneously (see the following equation) and the alkali catalyst is not released out of the system. Each of the variation rate of catalyst proportion and the variation rate of water proportion is calculated, every predetermined time interval (for example, every 10 minutes), from the numerical value obtained by calculating the mole ratio in the reaction system from the actual measured addition amount and dividing the calculated value by the initial mole value. The initial value refers to the value of mole ratio of the alkali catalyst or water to the silica seed particles in terms of silica (Si) in the liquid I.

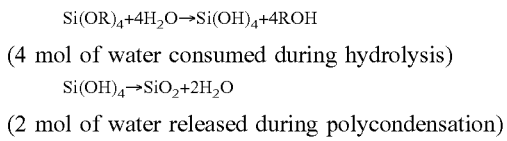

(4 mol of water consumed during hydrolysis)

$Si(OH)_4 \rightarrow SiO_2 + 2H_2O$ (2 mol of water released during polycondensation)

Advantageous Effect of Invention

The method of the present invention can efficiently produce silica particles by suppressing generation of incompletely reacted materials. In addition, when producing irregular-shaped silica particles in which primary particles are linked to each other, the method of the present invention can produce particles having a desired degree (number) of linking with high accuracy.

BRIEF DESCRIPTION OF DRAWINGS

FIG. 1 shows diagrams illustrating a method for calculating the average particle diameter in the present invention.

FIG. 2 is a graph showing the chronological change in the variation rate of catalyst proportion and the variation rate of water proportion in Example 1.

FIG. 3 is a graph showing the chronological change in the variation rate of catalyst proportion and the variation rate of water proportion in Example 2.

FIG. 4 is a graph showing the chronological change in the variation rate of catalyst proportion and the variation rate of water proportion in Example 3.

FIG. 5 is a graph showing the chronological change in the variation rate of catalyst proportion and the variation rate of water proportion in Comparative Example 1.

FIG. 6 is a graph showing the chronological change in the variation rate of catalyst proportion and the variation rate of water proportion in Comparative Example 2.

DESCRIPTION OF EMBODIMENTS

[Method for Producing Dispersion Liquid of Silica Particles]

The method for producing a dispersion liquid of silica particles of the present invention comprises: a step of providing a liquid I containing silica seed particles having an average particle diameter of 3 to 100 nm; and a step of simultaneously adding a liquid A containing silane alkoxide and a liquid B containing an alkali catalyst and water to the liquid I to cause the silica seed particles to grow, so as to produce silica particles. The method is characterized in that: the variation rate of the mole ratio of the alkali catalyst to silica components (variation rate of catalyst proportion) in the reaction system during a period from the start to the end of the addition relative to the initial mole ratio of the alkali catalyst to the silica components is 0.90 to 1.10; and the variation rate of the mole ratio of the water to the silica components (variation rate of water proportion) in the reaction system during a period from the start to the end of the addition relative to the initial mole ratio of the water to the silica components is 0.90 to 1.10.

The expression "start of the addition" in the production method of the present invention means the time of start of the addition of a liquid A and a liquid B to a liquid I. The expression "end of the addition" means the time of end of the addition of a liquid A and a liquid B.

By keeping the amounts of the alkali catalyst and water relative to the silica components in the reaction system to be constant during a reaction period from the start to the end of the addition, the reaction is always caused to proceed under the same conditions, and the generation of incompletely reacted materials is thereby suppressed. This makes it possible to eliminate a step of removing incompletely reacted materials and thus to efficiently produce a dispersion liquid of silica particles. In addition, the produced dispersion liquid of silica particles contains no incompletely reacted materials, and has therefore an excellent stability as a dispersion liquid of silica particles and an abrasive, and can provide an abrasive having good abrasive properties.

In addition, by using a liquid I containing the silica seed particles to cause the reaction to proceed under the above conditions, the generation of incompletely reacted materials is further suppressed as well as the particles that are controlled in shape to the intended shape can be produced in a shorter time. In particular, when producing irregular-shaped particles in which primary particles are linked to each other, the degree (number) of linking can easily be controlled and the intended particles can be produced with high accuracy. The method for producing silica particles using seed particles can provide silica particles having the equivalent size and shape in about ½ to 1/10 of the time taken by a conventional method using no seed particle.

<Liquid I (Liquid Provided in Advance in Container)>

A liquid I contains at least silica seed particles and an organic solvent, and preferably also water and an alkali catalyst. The liquid I preferably contains the adjusted amounts and proportions of water and the alkali catalyst. That is, the mole ratios of the alkali catalyst/silica seed particles and the water/silica seed particles in the liquid I are preferably adjusted in advance, in consideration of the mole ratios of alkali catalyst/silane alkoxide and water/silane alkoxide in a liquid A and a liquid B (addition liquids) to be added. This can keep the amounts of the alkali catalyst and water relative to the silica components in the reaction system to be constant during a reaction period from the start to the end of the addition.

Examples of the organic solvent include an alcohol, a ketone, an ether, a glycol and an ester, with an alcohol being preferred. More particularly, alcohols such as methanol, ethanol, propanol, and butanol; ketones such as methyl ethyl ketone and methyl isobutyl ketone; glycol ethers such as methyl cellosolve, ethyl cellosolve, and propylene glycol monopropyl ether; glycols such as ethylene glycol, propylene glycol, and hexylene glycol; and esters such as methyl acetate, ethyl acetate, methyl lactate, and ethyl lactate can be exemplified. Among them, methanol or ethanol is more preferred, and methanol is particularly preferred. These organic solvents may be used alone or as a mixture of two or more.

As alkali catalysts, compounds showing basic properties, such as ammonia, an amine, an alkali metal hydride, an alkali earth metal hydride, alkali metal hydroxide, an alkali earth metal hydroxide, a quaternary ammonium compound, and an amine-based coupling agent can be used, and it is preferred to use ammonia.

Examples of the silica seed particles contained in the liquid I include those produced by hydrolysis and polycondensation of a silane alkoxide represented by the following formula [1]:

$$X_nSi(OR)_{4-n} \qquad [1]$$

In the formula, X represents a hydrogen atom, a fluorine atom, an alkyl group having 1 to 8 carbon atoms, an aryl group, or a vinyl group; R represents a hydrogen atom, an alkyl group having 1 to 8 carbon atoms, an aryl group, or a vinyl group; and n is an integer of 0 to 3.

Examples of the silane alkoxide represented by the above formula [1] other than tetramethoxysilane and tetraethoxysilane include tetraisopropoxysilane, tetrabutoxysilane, tetoraoctoxysilane, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane, and trifluoromethyltriethoxysilane.

Among these silane alkoxides, those represented by the formula [1] wherein n is 0 and the alkyl chain of R is short, such as tetramethoxysilane (TMOS) and tetraethoxysilane (TEOS), are particularly preferably used. This is because using these results in a higher hydrolysis speed and tends not to leave incompletely reacted materials. Among them, tetramethoxysilane (TMOS) having a short alkyl chain is preferred.

The average particle diameter of silica seed particles is 3 to 100 nm as described above, but preferably 5 to 50 nm and more preferably 10 to 30 nm. If the particle diameter of the seed particles is within this range, the particles that are controlled in shape to the intended shape can be easily produced, and particularly when producing irregular-shaped particles in which primary particles are linked to each other, the degree (number) of linking can easily controlled.

<<Measurement Method of Average Particle Diameter>>

An average particle diameter is determined as follows: an electron micrograph of a silica particle is taken and 100 particles are arbitrarily selected therefrom; the longest diameter of the particle is measured for each of the 100 particles; and the average value is used as the average particle diameter.

The silica seed particles can be produced under conditions different from those during a period of growth of the silica particles of the present invention. That is, according to the present invention, it is possible to produce seed particles by employing conditions suitable for the production of the seed particles, and to produce particles during a period of growth of the particles by employing different conditions suitable for the production of the final product. Therefore, the production efficiency can be improved, and the intended final product can be obtained with higher accuracy. However, if the silica particles are produced in a series of steps without using seed particles, it is required that in consideration of the final product, the final product is produced under certain conditions suitable for it, and the production efficiency and accuracy as in the present invention cannot be obtained.

In addition, since a dispersion liquid of the seed particles can be produced under conditions different from those during a period of growth of the particles, a dispersion liquid containing a less amount of incompletely reacted materials can be produced. The liquid I prepared using the dispersion liquid of the seed particles separately produced in this manner have a very low content of the incompletely reacted materials. The content of the incompletely reacted materials in the liquid I is, for example, preferably 200 ppm or less, more preferably 150 ppm or less, and still more preferably 100 ppm or less. The produced dispersion liquid of the seed particles may be subjected to a purification treatment such as ultrafiltration to further reduce the content of the incompletely reacted materials. Since the liquid I contains almost no incompletely reacted material, the amount of the incompletely reacted materials in a dispersion liquid of silica particles after the particles have grown is very small.

<Incompletely Reacted Materials in Liquid I>

The incompletely reacted materials refer to silicon-containing compounds for which the reaction has not proceeded to provide the intended silica particles (seed particles). They are, for example, unreacted raw material silane alkoxide, its hydrolyzates (oligomers) having a low molecular weight, much smaller particles than particles which are intended to be produced, and the like. Specifically it refers to silicon-containing compounds in a supernatant obtained when centrifuging an aqueous dispersion liquid of silica particles at 10° C., 1,370,000 rpm (1,000,000 G) for 30 minutes with CS150GXL, a micro ultracentrifuge manufactured by Hitachi Koki Co., Ltd.

<<Measurement Method of Content of Incompletely Reacted Materials>>

For the silicon-containing compounds (incompletely reacted materials) in this supernatant, the $SiO_2$ concentrations are obtained from Si measured with ICP emission spectrometer ICPS-8100 manufactured by Shimadzu Corporation.

In addition, since the method for producing a dispersion liquid of seed particles can be performed using conditions different from those during a period of growth, desired seed particles can be produced. For example, it is possible to produce spherical silica seed uniform in particle diameter having sphericity of 0.80 to 1.00 and a variation coefficient of particle diameter (CV value) of 10% or less. By producing the intended silica particles using such seed particles, particles more suitable for the intended purpose can be produced. The sphericity of the silica seed particles is preferably 0.90 to 1.00. The variation coefficient of particle diameter (CV value) of the silica seed particles is preferably 8% or less.

<<Measurement Method of Sphericity>>

A sphericity is determined as follows: an electron micrograph of silica particles is taken and 100 particles are arbitrarily selected therefrom; the ratio of the longest diameter ($D_L$) to the short diameter orthogonal thereto ($D_S$) of the particle is determined for each of the 100 particles; and the average value of the ratio ($D_S/D_L$) is used as the average particle diameter.

<<Measurement Method of Variation Coefficient of Particle Diameter>>

The variation coefficient of particle diameter is calculated according to the following equation. A particle diameter and an average particle diameter of each individual particle used when determining the variation coefficient of particle diameter (CV value) is calculated by the method described above under the section "Measurement method of average particle diameter"

$$CV \text{ value} = \text{(Standard variation of particle diameter }(\sigma)\text{/Average particle diameter }(D_x))\times 100 \quad [\text{Expression 1}]$$

$$\text{Standard variation of particle diameter }(\sigma) = \sqrt{\frac{\Sigma(D_i - D_x)^2}{n-1}}$$

$D_i$: Particle diameter of individual particle, $n$:100

The concentration of the silica seed particles in the liquid I is preferably 1% by mass or more. From the viewpoint of efficiently producing irregular-shaped particles in which primary particles are linked to each other, it is more preferably 3% by mass or more, and still more preferably 5 to 10% by mass.

<<Measurement Method of Concentration of Silica Seed Particles in Liquid I>>

The concentration of the silica seed particles in the liquid I is calculated from the masses measured before and after drying 5 g of a sample at 1000° C. for 1 hour, according to the following equation:

Concentration of silica seed particles (% by mass)= (mass after drying/mass before drying)×100

According to this measurement method, incompletely reacted materials and the like other than the silica seed particles are also contained. However, according to the method of the present invention, the incompletely reacted materials and the like are in trace amounts, resulting in almost no influence. Therefore, the value determined by the above method is used as the concentration of the silica seed particles.

<Liquid A>

The liquid A contains silane alkoxide, and preferably further contains an organic solvent. Typically, it is substantially consisted of silane alkoxide, or substantially consisted of two components, i.e. silane alkoxide and an organic solvent. The expressions "substantially consist(ing) of silane alkoxide" and "substantially consist(ing) of two components" used herein mean that the inevitably contained impurities or the like derived from the process of generating the silane alkoxide or the organic solvent can be contained but other impurities or the like are not contained, and the content of the organic solvent or the content of silane alkoxide and the organic solvent is 99% by mass or more, and preferably 99.5% by mass or more.

Examples of the silane alkoxide include silane alkoxides represented by the above formula [1]. Specific silane alkoxide similar to that used in production of the seed particles can be used.

As organic solvents, the organic solvents exemplified as the above liquid I can be used, and the organic solvent having the same composition as the liquid I is preferably used. That is, when methanol is used in the liquid I, methanol is also preferably used in the liquid A.

When the liquid A contains an organic solvent, the concentration of silane alkoxide relative to the organic solvent is, for example, 1.5 to 6.4 mol/L, and preferably 2.0 to 6.0 mol/L.

<Liquid B>

The liquid B contains an alkali catalyst and water, and usually consists substantially of two components. The expression "consist(ing) substantially of two components" used herein have the same meaning as described above regarding the liquid A.

As alkali catalysts, those exemplified for the above liquid I can be used, and it is preferred to use ammonia.

Here, the concentration of the alkali catalyst relative to water in the liquid B is, for example, 1 to 24 mol/L, and preferably 3 to 15 mol/L.

<Reaction Conditions, Etc.>

A method for producing a dispersion liquid of silica particles of the present invention satisfies the following two conditions:

(1) the variation rate of catalyst proportion is 0.90 to 1.10; and (2) (1) the variation rate of water proportion is 0.90 to 1.10

Specifically, the production method according to the present invention is a method in which the variation rate of catalyst proportion and the variation rate of water proportion are intended to be reduced as much as possible and to keep the variation rates constant. Specific examples of the method include a method comprising using a liquid A and a liquid B in which the mole ratios of an alkali catalyst/silane alkoxide and water/silane alkoxide are adjusted, respectively, so that the mole ratios do not vary depending on the reaction with respect to the mole ratios of alkali catalyst/silica seed particles and water silica seed particles in a liquid I. Further examples of the method include a method comprising suppressing the variation rate of catalyst proportion and the variation rate of water proportion by keeping addition conditions such as addition speeds of the liquid A and the liquid B as constant as possible for a period from the start to the end of the addition. For example, the variation in the addition speed of each of the liquid A and the liquid B can be suppressed by using a highly accurate pump.

As a result, the reaction site is always under the same conditions, and the reaction can proceed under the same conditions, thereby suppressing generation of incompletely reacted materials. This makes it possible to eliminate a step of removing incompletely reacted materials and thus to efficiently produce a dispersion liquid of silica particles. In addition, this dispersion liquid of silica particles contains almost no incompletely reacted materials, and has therefore an excellent stability as a dispersion liquid of silica particles and an abrasive, and can provide an abrasive having good abrasive properties. In addition, particles with a uniform primary particle diameter can be produced.

The variation rate of catalyst proportion is preferably 0.90 to 1.10 as described above, more preferably 0.95 to 1.05, and still more preferably 0.98 to 1.02. The variation rate of water proportion is preferably 0.90 to 1.10 as described above, more preferably 0.95 to 1.05, and still more preferably 0.98 to 1.02.

In addition, when producing irregular-shaped silica particles in which two or more primary particles are linked to each other, the mass of the silane alkoxide to be added per minute with respect to the mass of the silica seed particles in the liquid I in terms of $SiO_2$ (silica) is preferably 10% by mass or more, more preferably 15% by mass, still more preferably 20% by mass and particularly preferably 20 to 35% by mass. The addition of the silane alkoxide at such a rate can promote the active coalescence of the primary particles to efficiently produce irregular-shaped silica particles in which primary particles are caused to coalesce to each other.

In addition, in the reaction system during a period from the start to the end of the addition, it is preferred that the mole ratio of the alkali catalyst to silica components is always 0.20 or more and the mole ratio of water to silica components is always 2.0 or more. That is, during the reaction, each of the amounts of the alkali catalyst and water relative to the amount of silica components are preferably kept at a predetermined value or more. By performing the reaction with the amounts of the alkali catalyst and water kept at the predetermined value or more relative to the amount of silica components, hydrolysis can sufficiently proceed, and the generation of incompletely reacted materials can be suppressed. The silica components in the reaction system have the same meaning as those in the variation rate of catalyst proportion and the like.

The mole ratio of the alkali catalyst to silica components is more preferably 0.30 or more, and still more preferably 0.50 to 1.00. The mole ratio of water to silica components is more preferably 3.0 or more, and still more preferably 3.5 to 15.0.

Further, the pH in the reaction system at the end of the reaction is preferably 11 or more, and more preferably 11.2 or more. According to the present invention, as described above, the pH at the end of the reaction can be 11 or more by adding the alkali catalyst and water the amounts of which are kept constant relative to the amount of silica components.

The reaction is usually performed under atmospheric pressure. The reaction temperature may be any temperature equal to or lower than the boiling point of the solvent to be used. However, the reaction temperature is preferably 0 to 65° C. and more preferably 10 to 50° C. to promote deposition of particles.

According to the production method of the present invention, the generation of incompletely reacted materials is suppressed. Therefore, it is not always necessary to perform heat-aging treatment, heat removal treatment, and purification treatment such as ultrafiltration, which have been conventionally performed to remove the incompletely reacted materials.

The silica concentration in the dispersion liquid of silica particles (reaction system) at the end of the addition is higher than that in the dispersion liquid produced by a conventional method and is, for example, 5% by mass or more, preferably 10% by mass or more, and more preferably 10 to 25% by mass.

<<Measurement Method of Concentration of Silica Particles in System>>

The concentration of the silica particles is calculated from the masses measured before and after drying 5 g of a sample at 1000° C. for 1 hour, according to the following equation:

Concentration of silica particles (% by mass)=(mass after drying/mass before drying)×100

According to this measurement method, incompletely reacted materials and the like other than the silica particles are also contained. However, according to the method of the present invention, the incompletely reacted materials and the like are in trace amounts, resulting in almost no influence. Therefore, the value determined by the above method is used as the concentration of silica particles.

[Dispersion Liquid of Silica Particles]

The dispersion liquid of silica particles produced according to a method of the present invention are useful as an abrasive, and may be used as it is or in a dried state. The content of incompletely reacted materials in the dispersion liquid of silica particles is preferably 200 ppm or less, more preferably 150 ppm or less, and still more preferably 100 ppm or less.

[Incompletely Reacted Materials in Dispersion Liquid of Silica Particles]

The term "incompletely reacted materials" refers to silicon-containing compounds other than the intended silica particles. It includes, for example, unreacted raw material silane alkoxide, its hydrolyzates (oligomers) having a low molecular weight, much smaller particles than particles which are intended to be produced, and the like. Specifically, it refers to silicon-containing compounds present in a supernatant obtained when centrifuging an aqueous dispersion liquid of silica particles by the method exemplified for the above liquid I.

<<Measurement Method of Content of Incompletely Reacted Materials>>

For the silicon-containing compounds (incompletely reacted materials) present in the supernatant, the silica ($SiO_2$) concentrations are obtained from Si measured by the method exemplified for the above liquid I.

Since the dispersion liquid of silica particles is almost free from incompletely reacted materials, when used in an abrasive, it has an excellent particle stability in the abrasive and deposits on substrate can be suppressed. The adsorption of and reaction with various chemicals added to the abrasives can be suppressed by these advantages, and these advantages can exert effects of the chemicals more effectively.

The silica particles contained in the dispersion liquid of silica particles form a three-dimensional polycondensation structure. This is due to the fact that hydrolysis and polycondensation of silane alkoxide occurring in an alkaline environment proceed not only in a planar state (in a two-dimensional manner) but also in a cubic manner (in a three-dimensional manner). An abrasive using a particle having such a structure is suitable because it has a high particle dispersibility and provides a sufficient polishing speed. On the other hand, hydrolysis and polycondensation of the silane alkoxide occurring in an acidic environment proceed in a two-dimensional manner, and hence a spherical particle cannot be obtained.

The structure can be determined by the presence of a particle observed with a transmission electron microscope or a scanning electron microscope.

The average particle diameter of primary silica particles contained in the dispersion liquid of silica particles is preferably 5 to 300 nm, and can be appropriately set in accordance with a required polishing speed, polishing precision, and so on.

When the average particle diameter is smaller than 5 nm, the dispersion liquid of silica particles tends to have insufficient stability, and the particle diameter may be too small to achieve a sufficient polishing speed. When the average particle diameter is larger than 300 nm, scratches are likely to generate and sufficient smoothness cannot be obtained in some cases when the silica particles are used as an abrasive, although depending on the types of substrate or insulating film. The average particle diameter is preferably 10 to 200 nm, and more preferably 15 to 100 nm.

<<Measurement Method of Average Particle Diameter>>

The method for calculating an average particle diameter (d) is described with reference to FIG. 1. FIG. 1 illustrates a particle in which a primary particle is present alone and a particle in which a plurality of primary particles are linked to each other, wherein each solid black area represents an interparticle junction part and each interparticle junction part may include a space. The particle diameter d is the longest diameter measured for the primary particle contained in each particle. The average particle diameter (d) is determined as follows: an electron micrograph of a silica particle is taken and 100 particles are arbitrarily selected therefrom; the longest diameter d of the primary particle is measured for each of the 100 particles; and the average value is used as the average particle diameter (d).

The dispersion liquid of silica particles comprises preferably 10% of more, more preferably 30% or more and still more preferably 50% or more of irregular-shaped silica particles in which two or more primary particles are linked to each other. The expression "irregular-shaped silica particles in which two or more primary particles are linked to each other" as used herein refers to a chain-shaped particle in which two or more, preferably two to ten particles (primary particles) identified as one spherical or truly spherical particle are linked to each other (see FIG. 1). From the viewpoint of abrasiveness, irregularly-shaped silica particles in which about two or three primary particles are linked to each other are preferable.

The number of the linked primary particles in the irregular-shaped silica particle and the proportion of the irregular-shaped silica particle in the system (irregular-shaped particle proportion) are determined by taking an electron micrograph of the irregular-shaped silica particles and observing 100 particles arbitrarily selected therefrom.

It is preferred that, the silica particle contained in the dispersion liquid of silica particles includes a content of each of U and Th of less than 0.3 ppb, a content of each of alkali metals, alkali earth metals, Fe, Ti, Zn, Pd, Ag, Mn, Co, Mo, Sn, Al, and Zr of less than 0.1 ppm, and a content of each of Cu, Ni, and Cr of less than 1 ppb. If within this range, the silica-based particle can be used as an abrasive grain for highly integrated logics and memories with a wiring node of 40 nm or less, and for three-dimensional implementation.

When the metal elements as impurity components are present in quantities larger than the above-mentioned ranges, the metal elements may remain on a substrate polished with the silica-based particle. The metal elements cause insulation failure to a circuit formed on a semiconductor substrate or short the circuit. This may decrease the dielectric constant of a film for insulation (insulating film) and increase the impedance of the metal wiring, leading to lowering of the response speed, increase of the power consumption, and so on. In addition, the metal element ions may migrate (diffuse), and such failures may be caused under some conditions for use or after a long-term use. In particular, U and Th generate radiation to cause malfunctions to a semiconductor device even when the amount of remaining U or Th is minute, and thus are not preferred.

Here, the alkali metal refers to Li, Na, K, Rb, Cs, or Fr. The alkali earth metal refers to Be, Mg, Ca, Sr, Ba, or Ra.

To obtain such a highly-pure silica particle with a small content of impurity components, it is preferred to use an apparatus the material of which is free of such elements and has high chemical resistance, in preparation of the particle. Specific preferred examples of the material include plastics such as Teflon®, FRP, and carbon fibers, and non-alkali glass.

In addition, it is preferred to purify raw materials to be used by distillation, ion exchange, or removal with a filter. In particular, alcohol used in hydrolysis of alkoxide, may be contaminated with metal impurity components from a tank and so on or with a catalyst during synthesis, and may require purification at a particularly high level.

As a method to obtain a highly-pure silica particle, there are methods comprising providing raw materials with a small content of impurity components in advance, or preventing contamination from an apparatus for particle preparation, as described above. Alternatively, it is possible to reduce impurity components for a particle prepared without sufficiently taking such countermeasures. However, as impurity components are incorporated in the silica particle, purification using ion exchange or removal with a filter would be inefficient, and high cost may be required. Thus, it is not practical for obtaining a silica particle with a small content of impurity components with such a method.

<<Measurement of Contents of Metal Elements>>

To determine the content of U and Th, the contents of alkali metals, alkali earth metals, Fe, Ti, Zn, Pd, Ag, Mn, Co, Mo, Sn, Al, and Zr, and the contents of Cu, Ni, and Cr in the silica particle, the silica particle is dissolved in hydrofluoric acid, and heated to remove the hydrofluoric acid and then added with pure water as necessary, and the resulting solution is subjected to measurement with an inductively coupled plasma (ICP) emission mass spectrometer (for example, ICPM-8500 manufactured by Shimadzu Corporation).

EXAMPLES

Hereinafter, the present invention will be described with reference to Examples. However, the present invention shall be not limited to these Examples.

Example 1

<Production of Dispersion Liquid of Silica Particles (A)>

180.0 g of a liquid I containing silica seed particles having an average particle diameter of 15 nm was kept at 50° C., and 1956.4 g of a methanol solution of tetramethoxysilane (manufactured by Tama Chemicals Co., Ltd.) (liquid A) and 546.0 g of aqueous ammonia (liquid B) were simultaneously added to the liquid I over 100 minutes. The compositions of the liquid I, the liquid A and the liquid B are shown in Table 1 (the compositions in the following Examples and Comparative Examples are also shown in Table 1).

The silica concentration in a dispersion liquid of silica particles at the end of the addition (end of the reaction) was 15.1% by mass. After completion of the addition, the mixture was further aged at the same temperature for 30 minutes. The solvent was substituted with pure water to obtain a dispersion liquid of silica particles (A) having a silica concentration of 20% by mass. Detailed production conditions and results of various measurements are shown in Table 2 (those in the following Examples and Comparative Examples are also shown in Table 2).

<<Measurement of Average Particle Diameter of Seed Particles>>

The average particle diameter of seed particles was determined as follows: an electron micrograph of seed particles was taken and 100 particles were arbitrarily selected therefrom; the longest diameter of the seed particle was measured for each of the 100 particles as illustrated in FIG. 1; and the average value was used as the average particle diameter.

<<Measurement of CV Value of Seed Particles>>

The CV value of the seed particles was determined by calculation from each of the above results.

<<Measurement of Sphericity of Seed Particles>>

A sphericity was determined as follows: an electron micrograph of seed particles was taken and 100 seed particles were arbitrarily selected therefrom; the ratio of the longest diameter ($D_L$) to the short diameter orthogonal thereto ($D_S$) of the seed particle was determined for each of the 100 seed particles; and the average value of the ratio ($D_S/D_L$) was used as the sphericity.

<<Measurement of Concentration of Silica Seed Particles in Liquid I>>

The concentration of the silica seed particles was calculated from the masses measured before and after drying 5 g of a sample at 1000° C. for 1 hour, according to the following equation:

Concentration of silica seed particles (% by mass)=
(mass after drying/mass before drying)×100

<<Measurement of Amount of Incompletely Reacted Materials in Liquid I>>

The amounts of incompletely reacted materials were measured as follows: the Si contents were measured with ICP emission spectrometer ICPS-8100 manufactured by Shimadzu Corporation for silicon-containing compounds (incompletely reacted materials) present in a supernatant obtained when centrifuging a liquid I at 10° C. and 1,370,000 rpm (1,000,000 G) for 30 minutes with a micro ultracentrifuge CS150GXL manufactured by Hitachi Koki Co., Ltd., and the comparison was performed with the $SiO_2$ concentrations calculated from the Si contents.

<<Variation Rate of Catalyst Proportion and Variation Rate of Water Proportion>>

Each of the mole ratios of "alkali catalyst/silane alkoxide" and "water/silane alkoxide" was calculated on the basis of the molar amount of silica components based on the mass of silica seed particles and the actual measured addition amount (by mass) of silane alkoxide (in terms of Si), assuming that the hydrolysis and polycondensation reactions of silane alkoxide take place instantaneously (see the following formulae) and the alkali catalyst is not released out of the system. Each of mole ratios in the reaction system was calculated from 10 minutes after the start of the addition of the liquids A and B and every 10 minutes thereafter. The variations of the mole ratios of each material in the system were compared by using the numerical values obtained by dividing the mole ratios by the mole ratios in the liquid I as the initial values.

$$Si(OR)_4 + 4H_2O \rightarrow Si(OH)_4 + 4ROH$$

(4 mol of water consumed during hydrolysis)

$$Si(OH)_4 \rightarrow SiO_2 + 2H_2O$$

(2 mol of water released during polycondensation)

<<Addition Speed of Silane Alkoxide>>

The amount of silane alkoxide to be added in the system per unit time (1 minute) was calculated as the mass ratio of the silane alkoxide to the silica seed particles in a liquid I. Both masses were determined in terms of silica ($SiO_2$).

<<Measurement of Concentration of Silica Components in System>>

The sample was collected every 10 minutes, 5 g of each sample was dried at 1000° C. for 1 hour, and the silica component concentration in the system was calculated from the mass before and after drying according to the following equation.

Silica component concentration in system (% by mass)=(mass after drying/mass before drying)×100

<<Measurement of Amount of Incompletely Reacted Materials in Dispersion Liquid of Silica Particles>>

The amounts of incompletely reacted materials were measured as follows: the Si contents were measured with ICP emission spectrometer ICPS-8100 manufactured by Shimadzu Corporation for silicon-containing compounds (incompletely reacted materials) present in a supernatant obtained when centrifuging the above-obtained dispersion liquid of silica particles having a silica concentration of 20% by mass at a predetermined temperature of 10° C. and 1,370,000 rpm (1,000,000 G) for 30 minutes with a micro ultracentrifuge CS150GXL manufactured by Hitachi Koki Co., Ltd., and the comparison was performed with the $SiO_2$ concentrations calculated from the Si contents.

<<Measurement of Average Particle Diameter of Primary Particles in Dispersion Liquid of Silica Particles>>

The average particle diameter of primary particles was determined as follows: an electron micrograph of silica particles was taken and 100 particles were arbitrarily selected therefrom; the longest diameter of the primary particle (sometimes, in a short diameter direction of a chain-shaped particle) was measured for each of the 100 particles as illustrated in FIG. 1; and the average value was used as the average particle diameter.

<<CV Value of Primary Particle Diameter>>

The CV value of the primary particle diameter was determined by calculation using each of the above results.

<<Proportion of Irregular-Shaped Silica Particles in Dispersion Liquid of Silica Particles Produced (Irregular-Shaped Particle Proportion)>>

The proportion of irregular-shaped silica particles in the system in which two or more primary particles are linked to each other was determined by taking an electron micrograph of the particles and observing 100 particles arbitrarily selected therefrom.

<<Number of Linked Primary Particles in Irregular-Shaped Silica Particle>>

The average number of linked primary particles in the irregular-shaped silica particle was determined by taking an electron micrograph of the irregular-shaped silica particles and observing 100 particles arbitrarily selected therefrom.

<Production and Evaluation of Abrasive (A)>

An abrasive (A) containing 3.0% by mass of the silica particles produced in Example 1, 175 ppm of hydroxyethyl cellulose (HEC) and 225 ppm of ammonia was prepared. The results of performance evaluation of the abrasive are shown in Table 2 (those in the following Examples and Comparative Examples are also shown in Table 2).

<<Stability Test of Abrasive (Slurry)>>

The stability of the abrasive (slurry) was evaluated by the presence or absence of white turbidity in the abrasive (A) produced in the above <Production of abrasive (A)>.

White turbidity absent: Good
White turbidity present: Poor

<<Polishing Test>>

The substrate for polishing (a single crystal silicon wafer having a crystal structure of 1.0.0) was used and set in a polishing machine (NF300, manufactured by Nano Factor Co., Ltd.), and polished for 10 minutes by use of a polishing pad SUBA600 with a load of 15 kPa applied to the substrate at a table rotation speed of 50 rpm, and a spindle speed of 60 rpm while the abrasive (A) was fed at a speed of 250 mL/min. Thereafter, the substrate was washed with pure water and air-dried.

Then, the polished surface of the resulting polished substrate was observed, and the smoothness of the surface was evaluated by using the following criteria (degree of scratches).

Almost no scratch found: Good
A few scratches found: Fair
Scratches found over a wide area: Poor For silica components remaining on the polished substrate, the degree of remaining was observed by using a laser microscope (VK-X250, manufactured by KEYENCE CORPORATION), and evaluated by using the following criteria.

Almost no silica component remained: Good
A few silica components remained: Fair
Silica components remained over a wide area: Poor Example 2

<Production of Dispersion Liquid of Silica Particles (B)

185.95 g of a liquid I containing silica seed particles having an average particle diameter of 25 nm was kept at 50° C., and 1956.4 g of a methanol solution of tetramethoxysilane (manufactured by Tama Chemicals Co., Ltd.) (liquid A) and 709.0 g of aqueous ammonia (liquid B) were simultaneously added to the liquid I over 80 minutes.

The silica concentration in the dispersion liquid of silica particles at the end of the addition was 14.2% by mass. After completion of the addition, the mixture was further aged at the same temperature for 1 hour. The solvent was substituted with pure water to obtain a dispersion liquid of silica particles (B) having a silica concentration of 20% by mass.

<Production and Evaluation of Abrasive (B)>

An abrasive (B) was produced and its performance was evaluated in the same manner as in Example 1 except that the dispersion liquid of silica particles (B) was used.

Example 3

<Production of Dispersion Liquid of Silica Particles (C)>

180.0 g of a liquid I containing silica seed particles having an average particle diameter of 15 nm was kept at 50° C., and 1956.4 g of a methanol solution of tetramethoxysilane (manufactured by Tama Chemicals Co., Ltd.) (liquid A) and 546.0 g of aqueous ammonia (liquid B) were simultaneously added to the liquid I over 200 minutes. In this example, the liquid I having a lower concentration of silica seed particles was used.

The silica concentration in the dispersion liquid of silica particles at the end of the addition was 14.9% by mass. After completion of the addition, the mixture was further aged at the same temperature for 30 minutes. The solvent was substituted with pure water to obtain a dispersion liquid of silica particles (C) having a silica concentration of 20% by mass.

<Production and Evaluation of Abrasive (C)>

An abrasive (C) was produced and its performance was evaluated in the same manner as in Example 1 except that the dispersion liquid of silica particles (C) was used.

Comparative Example 1

<Production of Dispersion Liquid of Silica Particles (D)>

180.0 g of a liquid I containing silica seed particles having an average particle diameter of 15 nm was kept at 50° C., and 3051.97 g of a methanol solution of tetramethoxysilane (manufactured by Tama Chemicals Co., Ltd.) (liquid A) and 546.0 g of aqueous ammonia (liquid B) were simultaneously added to the liquid I over 100 minutes. In this Comparative Example, the composition of the liquid A was changed from that of Example 1.

The catalyst proportion in the reaction system during a period from the start to the end of the addition (alkali catalyst/silica components) varied from 0.86 to 1.00, and the water proportion (water/silica components) varied from 0.60 to 1.00.

The silica concentration in the dispersion liquid of silica particles at the end of the addition was 16.5% by mass. After completion of the addition, the mixture was further aged at the same temperature for 30 minutes. The solvent was substituted with pure water to obtain a dispersion liquid of silica particles (D) having a silica concentration of 20% by mass.

<Production and Evaluation of Abrasive (D)>

An abrasive (D) was produced and its performance was evaluated in the same manner as in Example 1 except that the dispersion liquid of silica particles (D) was used.

Comparative Example 2

<Production of dispersion liquid of silica particles (E)>

180.0 g of a liquid I containing silica seed particles having an average particle diameter of 15 nm was kept at 50° C., and 1956.4 g of a methanol solution of tetramethoxysilane (manufactured by Tama Chemicals Co., Ltd.) (liquid A) and 344.0 g of aqueous ammonia (liquid B) were simultaneously added to the liquid I over 100 minutes. In this Comparative Example, the composition of the liquid B was changed from that of Example 1.

The catalyst proportion in the reaction system during a period from the start to the end of the addition (alkali catalyst/silica components) varied from 0.60 to 1.00, and the water proportion (water/silica components) varied from 0.60 to 1.00.

The silica concentration in the dispersion liquid of silica particles at the end of the addition was 16.3% by mass. After completion of the addition, the mixture was further aged at the same temperature for 30 minutes. The solvent was substituted with pure water to obtain a dispersion liquid of silica particles (E) having a silica concentration of 20% by mass.

<Production and Evaluation of Abrasive (E)>

An abrasive (E) was produced and its performance was evaluated in the same manner as in Example 1 except that the dispersion liquid of silica particles (E) was used.

TABLE 1

| | | Example 1 | Example 2 | Example 3 | Comparative Example 1 | Comparative Example 2 |
|---|---|---|---|---|---|---|
| Liquid I | Silica seed particles (g) | 14.2 | 14.2 | 9.00 | 14.2 | 14.2 |
| | Methanol content (g) | 154.35 | 154.35 | 163.75 | 154.35 | 154.35 |
| | Water content (g) | 8.95 | 14.90 | 5.66 | 8.95 | 8.95 |
| | Ammonia content (g) | 2.50 | 2.50 | 1.59 | 2.50 | 2.50 |
| | Total content of liquid I (g) | 180.00 | 185.95 | 180.00 | 180.00 | 180.00 |
| | Average particle diameter of seed particles (nm) | 15 | 25 | 15 | 15 | 15 |
| | CV value of seed particles (%) | 3 | 5 | 3 | 3 | 3 |
| | Sphericity of seed particles | 0.95 | 0.96 | 0.95 | 0.95 | 0.95 |
| | Concentration of silica seed particles (%) | 7.9 | 7.6 | 5.0 | 7.9 | 7.9 |
| | Content of incompletely reacted materials (ppm) | 90 | 110 | 90 | 90 | 90 |
| Liquid A | Tetramethoxysilane (g) | 984.27 | 984.27 | 984.27 | 1535.46 | 984.27 |
| | Methanol (g) | 972.12 | 972.12 | 972.12 | 1516.51 | 972.12 |
| Liquid B | Water (g) | 312.00 | 475.00 | 312.00 | 312.00 | 260.00 |
| | 29% Aqueous ammonia (g) | 234.00 | 234.00 | 234.00 | 234.00 | 84.00 |
| Mole ratio of alkali catalyst/silica seed particles (initial value) | | 0.62 | 0.62 | 0.62 | 0.62 | 0.62 |
| Mole ratio of water/silica seed particles (initial value) | | 2.10 | 3.50 | 2.10 | 2.10 | 2.10 |

TABLE 2

|  | Example 1 | Example 2 | Example 3 | Comparative Example 1 | Comparative Example 2 |
|---|---|---|---|---|---|
| Variation rate of catalyst proportion | 1.00 | 1.00 | 1.00 | 0.86-1.00 | 0.60-1.00 |
| Variation rate of water proportion | 1.00 | 1.00 | 1.00 | 0.60-1.00 | 0.60-1.00 |
| Hydrolysis temperature (° C.) | 30 | 30 | 30 | 30 | 30 |
| Hydrolysis time (min) | 100 | 80 | 200 | 100 | 100 |
| Addition amount of silane alkoxide/seed particles (% by mass in terms of silica/min) | 27.5 | 34.3 | 21.7 | 42.82 | 27.5 |
| pH at end of addition | 11.3 | 11.2 | 11.3 | 10.5 | 10.2 |
| Concentration at end of addition (% by mass) | 15.1 | 14.2 | 14.9 | 16.5 | 16.3 |
| Aging temperature (° C.) | 30 | 30 | 30 | 30 | 30 |
| Aging time (min) | 30 | 60 | 30 | 30 | 30 |
| Amount of incompletely reacted materials (ppm) | 80 | 90 | 90 | 450 | 400 |
| Average particle diameter of primary particle (nm) | 58 | 72 | 62 | 42 | 49 |
| CV value of primary particle diameter (%) | 3 | 5 | 8 | 25 | 20 |
| Irregular-shaped particle proportion (%) | 65 | 70 | 60 | 35 | 30 |
| Number of linked particles | 2.7 | 2.9 | 2.5 | 1.3 | 1.5 |
| Shape | Irregular | Irregular | Irregular | Irregular (Many small particles) | Irregular (Many small particles) |
| Slurry stability | Good | Good | Good | Poor | Poor |
| Polishing property (scratches) | Good | Good | Good | Poor | Poor |
| Polishing property (silica components remaining) | Good | Good | Good | Poor | Poor |

It is shown from Table 2 that the dispersion liquid of silica particles produced in each of Examples 1 to 3 had an irregular-shaped silica particle efficiently produced. The dispersion liquid of silica particles had less incompletely reacted materials than that produced in Comparative Examples 1 and 2 and also had excellent slurry stability and polishing property.

The invention claimed is:

1. A method for producing a dispersion liquid of silica particles, comprising:
   providing a liquid I containing silica seed particles having an average particle diameter of 3 to 100 nm in a container; and
   simultaneously adding a liquid A containing silane alkoxide and a liquid B containing an alkali catalyst and water to the liquid I to grow the silica seed particles, so as to produce silica particles;
   wherein a variation rate of a mole ratio of the alkali catalyst to silica components in a reaction system during a period from a start to an end of an addition relative to the initial mole ratio of the alkali catalyst to the silica components is 0.90 to 1.10; and
   wherein a variation rate of a mole ratio of the water to silica components in the reaction system during the period from the start to the end of the addition relative to the initial mole ratio of the water to the silica components is 0.90 to 1.10;
   wherein an addition amount of the silane alkoxide is 10% by mass or more per minute with respect to the silica seed particles in the liquid I in terms of $SiO_2$.

2. The method for producing a dispersion liquid of silica particles according to claim 1, wherein the silica seed particle concentration in the liquid I is 1% by mass or more.

3. The method for producing a dispersion liquid of silica particles according to claim 1, wherein a content of incompletely reacted materials in the liquid I is 200 ppm or less.

4. The method for producing a dispersion liquid of silica particles according to claim 1, wherein the silica particles produced are irregular-shaped silica particles in which two or more primary particles are linked to each other.

5. The method for producing a dispersion liquid of silica particles according to claim 1, wherein the concentration of the silica particles in the reaction system at the end of the addition is 5% by mass or more.

6. The method for producing a dispersion liquid of silica particles according to claim 1, wherein the concentration of the incompletely reacted materials in the reaction system at the end of the addition is 200 ppm or less.

7. The method for producing a dispersion liquid of silica particles according to claim 1, wherein during the period from the start to the end of the addition, the mole ratio of the alkali catalyst to the silica components in the reaction system is always 0.20 or more and the mole ratio of the water to the silica components in the reaction system is always 2.0 or more.

8. The method for producing a dispersion liquid of silica particles according to claim 1, wherein the temperature of the reaction system is 0 to 65° C.

9. A method for producing a dispersion liquid of silica particles, comprising:
   providing a liquid I containing silica seed particles having an average particle diameter of 3 to 100 nm, a sphericity of the silica seed particles is 0.80 to 1.00, and a variation coefficient (CV value) of particle diameter is 10% or less in a container; and simultaneously adding a liquid A containing silane alkoxide and a liquid B containing an alkali catalyst and water to the liquid I to grow the silica seed particles, so as to produce silica particles;

wherein a variation rate of a mole ratio of the alkali catalyst to silica components in a reaction system during a period from a start to an end of an addition relative to the initial mole ratio of the alkali catalyst to the silica components is 0.90 to 1.10; and wherein a variation rate of a mole ratio of the water to the silica components in the reaction system during the period from the start to the end of the addition relative to the initial mole ratio of the water to the silica components is 0.90 to 1.10.

10. The method for producing a dispersion liquid of silica particles according to claim 9, wherein the silica seed particle concentration in the liquid I is 1% by mass or more.

11. The method for producing a dispersion liquid of silica particles according to claim 9, wherein a content of incompletely reacted materials in the liquid I is 200 ppm or less.

12. The method for producing a dispersion liquid of silica particles according to claim 9, wherein the silica particles produced are irregular-shaped silica particles in which two or more primary particles are linked to each other.

13. The method for producing a dispersion liquid of silica particles according to claim 9, wherein the concentration of the silica particles in the reaction system at the end of the addition is 5% by mass or more.

14. The method for producing a dispersion liquid of silica particles according to claim 9, wherein the concentration of the incompletely reacted materials in the reaction system at the end of the addition is 200 ppm or less.

15. The method for producing a dispersion liquid of silica particles according to claim 9, wherein during the period from the start to the end of the addition, the mole ratio of the alkali catalyst to the silica components in the reaction system is always 0.20 or more and the mole ratio of the water to the silica components in the reaction system is always 2.0 or more.

16. The method for producing a dispersion liquid of silica particles according to claim 9, wherein the temperature of the reaction system is 0 to 65° C.

* * * * *